US006992924B2

(12) United States Patent
Miyatake et al.

(10) Patent No.: US 6,992,924 B2
(45) Date of Patent: Jan. 31, 2006

(54) MAGNETIC MEMORY AND METHOD FOR OPTIMIZING WRITE CURRENT IN A MAGNETIC MEMORY

(75) Inventors: Hisatada Miyatake, Ohtsu (JP); Hiroshi Umezaki, Fujisawa (JP); Kohji Kitamura, Kusatsu (JP); Toshio Sunaga, Ohtsu (JP); Kohki Noda, Fujisawa (JP); Hideo Asano, Machida (JP)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 10/680,051

(22) Filed: Oct. 7, 2003

(65) Prior Publication Data

US 2004/0090835 A1 May 13, 2004

(30) Foreign Application Priority Data

Oct. 7, 2002 (JP) ...................................... 2002-293309

(51) Int. Cl.
*G11C 11/15* (2006.01)

(52) U.S. Cl. ........................................ 365/171; 365/158

(58) Field of Classification Search ................. 365/171, 365/158, 189.08
See application file for complete search history.

(56) References Cited

U.S. PATENT DOCUMENTS

| | | | | |
|---|---|---|---|---|
| 6,111,783 A | | 8/2000 | Tran et al. | 365/171 |
| 6,657,889 B1 | * | 12/2003 | Subramanian et al. | 365/158 |
| 6,714,440 B2 | * | 3/2004 | Subramanian et al. | 365/158 |

OTHER PUBLICATIONS

R. Scheuerlein, W. Gallagher, S. Parkin, A. Lee, S, Ray, R Robertazzi, W. Reohr, "A 10ns Read and Write Non–Volatile Memory Array Using A Magnetic Tunnel Junction and FET Switch in each Cell," IEEE ISSCC Dig. Tech. Papers, 2000, pp. 128–129.

M. Durlam, P. Naji, M. DeHerrera, S, Tehrani, G. Kerszykowski, K, Kyler, "Nonvolatile RAM base on Magnetic Tunnel Junction Elements", IEEE ISSCC Dig. Tech. Papers, 2000 pp 130–131.

Hurd, Kevin A., "A 600MHz 64b PA–RISC Microprocessor", IEEE ISSCC Dig. Tech. Papers, 2000 pp 94–95.

* cited by examiner

*Primary Examiner*—Son T. Dinh
*Assistant Examiner*—Hien Nguyen
(74) *Attorney, Agent, or Firm*—Kunzler & Associates

(57) ABSTRACT

The invention provides methods and apparatus for for determining and providing optimum write bit line current and write word line current in an MRAM. A single reference potential is used to determine the values of the write line current and the bit line current. In determining the optimal values, asteroid curves representing bit line magnetic fields $H_x$ generated by write bit line current $I_B$ and word line magnetic fields $H_y$ generated by write word line current $I_w$ for magnetization are considered, and an asteroid curve $AC_{out}$ is defined outside the asteroid curves of all memory cells taking manufacture variations and design margins into account. A write bit line current and a write word line current are selected such that the write current obtained by adding the write bit line current or currents and the write word line current, or the write power consumed by the bit line or lines and the write word line is minimized. Furthermore, in order to prevent multi-selection, the write bit line current and the write word line current are selected so that they generate a synthetic magnetic field on the curve between calculated points of the asteroid curve $AC_{out}$.

20 Claims, 6 Drawing Sheets

MAGNETIC MEMORY AND METHOD FOR OPTIMIZING WRITE CURRENT IN A MAGNETIC MEMORY

DETAILED DESCRIPTION OF THE INVENTION

1. Field of the Invention

The present invention relates to methods for optimizing a write current in a magnetic memory device and to a magnetic memory device. More particularly, the present invention relates to methods for optimizing a write current in a magnetic random access memory (hereinafter referred to as MRAM) and to a magnetic memory device.

2. Background Art

Currently, an MRAM is receiving attention as a nonvolatile storage. The MRAM uses magnetic tunneling junction (hereinafter referred to as "MTJ") device as its magnetic memory element.

FIG. 3 is a sectional view illustrating an exemplary structure of an MRAM memory cell. The memory cell shown in FIG. 3 has an MTJ device 12 and a transistor 50. The transistor 50 is formed on the main surface of a p-type semiconductor substrate 100 typically formed of silicon. On the main surface of the semiconductor substrate 100, n-type diffusion regions 101 and 102 are formed with a predetermined gap provided there between. A read word line RWL is formed between the n-type diffusion regions 101 and 102 on the semiconductor substrate 100. The read word line RWL corresponds to the gate of the transistor 50. Device isolation regions 103 and 104 are formed between the transistor 50 and other adjoining transistors (not shown).

The n-type diffusion region 101 is connected to a metal wire 107 through a contact hole 105. The metal wire 107 is connected to a ground potential node 130. The write word line WWL is formed above the metal wire 107 with an insulating film (not shown) between them. The n-type diffuision region 102 is connected to a metal wire 108 through a contact hole 106. The metal wire 108 is further connected to a metal wire 110 through a contact hole 109. The metal wire 110 is connected to a pad metal 112 through a contact hole 111. The pad metal 112 is a conductor for connecting the MTJ device 12 and the metal wire 110. The MTJ device 12 is formed on the pad metal 112. The MTJ device 12 includes a ferromagnetic free layer 120, an insulating layer 121 and a ferromagnetic pinned layer 122. The pinned layer 122 is designed to have a fixed magnetization direction so that the magnetization can not be reversed. The magnetization direction of the free layer 120 will be identical to or opposite from that of the pinned layer 122 according to data to be stored. A bit line BL is formed on the MTJ device 12.

The read operation of the MRAM memory cell described above will now be explained.

In a read operation, the read word line RWL is selected, and the transistor 50 turned ON. This causes the MTJ device 12 to be connected to a ground potential node Vss. At this time, a sense current passes through the bit line BL. The resistance of the MTJ device 12 is low when the direction of the magnetic field of the free layer 120 is the same as that of the pinned layer 122, while it is high when the direction of the magnetic field thereof is opposite from that of the pinned layer 122. Thus, data stored in a memory cell can be read by detecting the current through the MTJ device 12 or the voltage drop across the MTJ device 12.

The write operation of the MRAM will now be explained.

In a write operation, a write word line current $I_w$ passes through a write word line WWL, and a write bit line current $I_B$ passes through the bit line BL. The read word line RWL is not selected, so that the transistor 50 is OFF.

FIG. 4 illustrates the switching of the magnetization direction of the free layer 120. Referring to FIG. 4, the write bit line current $I_B$ generates a bit line magnetic field in the direction of an easy magnetization axis of the free layer 120. The write word line current $I_W$ generates a word line magnetic field in the direction of a hard magnetization axis of the free layer 120. The word line magnetic field lowers the intensity of the bit line magnetic field required for changing the magnetization direction.

FIG. 5 shows an asteroid curve illustrating a critical magnetic field for switching the magnetization direction. Referring to FIG. 5, the axis of abscissa indicates a bit line magnetic field $H_x$ generated by the write bit line current $I_B$, while the axis of ordinate indicates a word line magnetic field $H_y$ generated by the write word line current $I_W$. If a magnetic field $H_x+H_y$ corresponding to the region inside the asteroid curve is generated, then the magnetization direction of the free layer 120 is not reversed, and the write operation is not performed. If a magnetic field $H_x+H_y$ corresponding to the region outside the asteroid curve is generated, then the magnetization direction of the free layer 120 is determined by the magnetic field, and the write operation is performed.

One of the challenges to developing MRAMs is a large current required for generating the magnetic field in the write operation. For instance, the power consumed for reading performed every 10 ns in an MRAM is typically 5 mW. The same MRAM consumes 40 mW for writing under the same condition, spending far more power than in the read operation. In this case, a power source voltage is 2.5 V. Hence, the averaged value of the write current (write bit line current $I_B$ +write word line current $I_W$) in the write operation is 16 mA. In actual operations, the write current flows for 2.5 ns during a write operation, so that the actual write current is 64 mA. In the write operation, therefore, much power is consumed and noise is generated, due to a write current with a large peak, leading to a possibility of a circuit malfunction.

FIGS. 6 and 7 are functional block diagrams illustrating the constructions related to the write operation of a memory cell array in the MRAM. In the twin cell type MRAM shown in FIG. 6, bit lines BLT and BLC are connected to each write circuit WC. The bit lines BLT and BLC are interconnected outside the memory cell array. The twin cells are disposed at the intersections of the bit lines BLT, BLC and the write word lines WWL. In a one transistor and one MTJ device type MRAM shown in FIG. 7, a bit line BL is connected between a write circuit WC1 and a write circuit WC2 disposed opposite from the write circuit WC1. The memory cells are disposed, corresponding to the intersections of the write word lines WWL and the bit lines BL. The MRAM shown in FIGS. 6 and 7 includes n bit lines per word. In response to a write address signal, one write word line and n bit lines are selected, and data is written to the memory cells located at the intersections of the write word line and the n bit lines. Thus, in the write operation, the write bit line current $I_B$ passes through all the selected n bit lines as well as the write word line current $I_w$ passing through the selected write word line. This means that the consumed power increases as the number of bit lines per word increases, and the probability of occurrence of noise increases accordingly. The write current should be preferably smaller to suppress power consumption and noise; however, an excessively small write current prevents a write operation from being accomplished.

SUMMARY OF THE INVENTION

According to one aspect of the present invention, there is provided a method for optimizing write current in a magnetic memory having a plurality of bit lines, a plurality of word lines crossing the bit lines, and a plurality of memory cells disposed at intersections of the bit lines and the word lines, each of the memory cells including a free layer with reversible magnetization and a pinned layer with fixed magnetization, the method including a step for determining a distance $r_B$ from the bit lines to the free layers, a distance $r_W$ from the word lines to the free layers, and a number n of the bit lines through which write bit line current $I_B$ passes in a write operation, and a step for determining the write bit line current $I_B$ and the write word line current $I_W$ so as to minimize the write current $I_T$ by using expression (1) representing an asteroid curve expressed by a bit line magnetic field $H_x$ generated by the bit line current $I_B$, a word line magnetic field $H_y$ generated by the write word line current $I_W$ passing through the word line in the write operation, and a predetermined constant $H_K$, expression (2) representing write current $I_T$ obtained by adding the write bit line current $I_B$ and the write word line current $I_W$, expression (3) representing the bit line magnetic field $H_x$ generated by the bit line current $I_B$ by using a predefined coefficient a, and expression (4) representing the word line magnetic field $H_y$ generated by the word line current $I_W$ by using the predefined coefficient a:

[Expression 3]

$$H_x^{\frac{2}{3}} + H_y^{\frac{2}{3}} = H_k^{\frac{2}{3}} \tag{1}$$

$$I_T = n\ I_B + I_W \tag{2}$$

$$H_x = a\frac{I_B}{r_B} \tag{3}$$

$$H_y = a\frac{I_W}{r_W} \tag{4}$$

According to the method for optimizing write current, the write bit line current $I_B$ and the write word line current $I_W$ are determined so as to generate the magnetic field on the asteroid curve given by expression (1) and to minimize the write current $I_T$ that is given by expression (2). Hence, the magnetization direction of the free layers can be securely determined, that is, the magnetization direction can be switched, if necessary, by a minimum write current $I_T$. Furthermore, since the write current $I_T$ is minimized, occurrence of noise attributable to a change in the write current $I_T$ can be suppressed.

According to another aspect of the present invention, there is provided a method for optimizing write current in a magnetic memory comprising a plurality of bit lines, a plurality of word lines crossing the bit lines, and a plurality of memory cells disposed at intersections of the bit lines and the word lines, each of the memory cells having a free layer with reversible magnetization and a pinned layer with fixed magnetization, the method including a step for determining a distance $r_B$ from the bit lines to the free layers, a distance $r_W$ from the word lines to the free layers, a number n of the bit lines through which write bit line current $I_B$ passes in a write operation, a parasitic resistance $R_B$ of the bit line, and a parasitic resistance $R_W$ of the word line, and a step for determining the write bit line current $I_B$ and the write word line current $I_W$ so as to minimize write power $P_d$ by using expression (5) representing an asteroid curve expressed by a bit line magnetic field $H_x$ generated by the bit line current $I_B$, a word line magnetic field $H_y$ generated by the word line current $I_W$ and a predetermined constant $H_K$, expression (6) representing write power $P_d$ consumed by the word lines and the bit lines by using the write bit line current $I_B$ and the write word line current $I_W$, expression (7) representing the bit line magnetic field $H_x$ generated by the bit line current $I_B$ by using a predetermined coefficient a, and expression (8) representing the word line magnetic field $H_y$ generated by the word line current $I_W$ by using the coefficient a.

[Expression 4]

$$H_x^{\frac{2}{3}} + H_y^{\frac{2}{3}} = H_k^{\frac{2}{3}} \tag{5}$$

$$P_d = n\ I_B^2 R_B + I_W^2 R_W \tag{6}$$

$$H_x = a\frac{I_B}{r_B} \tag{7}$$

$$H_y = a\frac{I_W}{r_W} \tag{8}$$

According to the method for optimizing write current, the write bit line current $I_B$ and the write word line current $I_W$ are determined so as to generate the magnetic field on the asteroid curve given by expression (5) and to minimize the write power $P_d$ that is given by expression (6). Hence, the magnetization direction of the free layers can be securely determined or the magnetization direction can be switched if necessary, by a minimum write power $P_d$. Furthermore, since the write power $P_d$ is minimized, excessive heat generation caused by write power can be restrained.

Preferably, the constant $H_K$ is given by expression (9) using a predetermined design margin $m_1$ when the minimum bit line magnetic field that makes it possible to reverse the magnetization of the free layers in any one of the memory cells associated with the bit line through which the write bit line current $I_B$ passes when $H_y$=0 or the minimum word line magnetic field that makes it possible to reverse the magnetization of the free layers in any one of the memory cells associated with the word line through which the write word line current $I_W$ passes when $H_x$=0 is denoted by $H_U$.

$$H_K = H_U + m_1 \tag{9}$$

In this case, the asteroid curve given by expression (1) or (5) will be positioned outside a maximum asteroid curve among the asteroid curves that vary from a memory cell to another. Hence, the write bit line current $I_B$ and the write word line current $I_W$ are determined on the maximum asteroid curve, thereby making it possible to securely switch the magnetization direction of the free layers to be switched in any one of selected memory cells.

Preferably, the bit line magnetic field $H_x$ and the word line magnetic field $H_y$ are given by expressions (10) and (11) using predetermined design margins $m_2$ and $m_3$, respectively, when the maximum bit line magnetic field that makes it impossible to reverse the magnetization of the free layers in any one of the memory cells when $H_y$=0 or the maximum word line magnetic field that makes it impossible to reverse the magnetization of the free layers in any one of the memory cells when $H_x$=0 is denoted by $H_L$, where $m_2$=$m_3$ or $m_2 \neq m_3$.

$$|H_x| \leqq H_{1x} = H_L - m_2 \tag{10}$$

$$|H_y| \leqq H_{2Y} = H_L - m_3 \tag{11}$$

In this case, the bit line magnetic field $H_x$ and the word line magnetic field $H_y$ are restricted by expressions (10) and (11), making it possible to prevent "multi-selection."

According to yet another aspect of the present invention, there is provided a magnetic memory having a plurality of bit lines, a plurality of word lines crossing the bit lines, a plurality of magnetic memory elements disposed corresponding to intersections of the bit lines and the word lines, a reference potential generating means for generating a predetermined reference potential, a write bit line current controlling means for controlling write bit line current passing through the bit lines in a write operation on the basis of a reference potential generated by the reference potential generating means, and a write word line current controlling means for controlling write word line current passing through the word lines in the write operation on the basis of a reference potential generated by the reference potential generating means.

In this magnetic memory, a common reference potential is supplied to the write bit line current controlling means and the write word line current controlling means. The write bit line current controlling means controls a write bit line current on the basis of the reference potential, while the write word line current controlling means controls a write word line current on the basis of the same reference potential. Therefore, the write bit line current and the write word line current change in synchronization, so that their ratio can be always maintained to be constant.

Preferably, the write bit line current controlling means includes a first transistor having a gate for receiving a reference potential, and passing a write bit line current. The write word line current controlling means includes a second transistor having a gate for receiving a reference potential, and passing a write word line current.

Further preferably, the ratio of the channel width/channel length of the first transistor to the channel width/channel length of the second transistor is set to be substantially equal to the ratio of the write bit line current to the write word line current.

In this case, optimum write bit line current and write word line current can be set by appropriately setting the channel widths and channel lengths of the transistors.

DETAILED DESCRIPTION OF THE INVENTION

Figure 1:
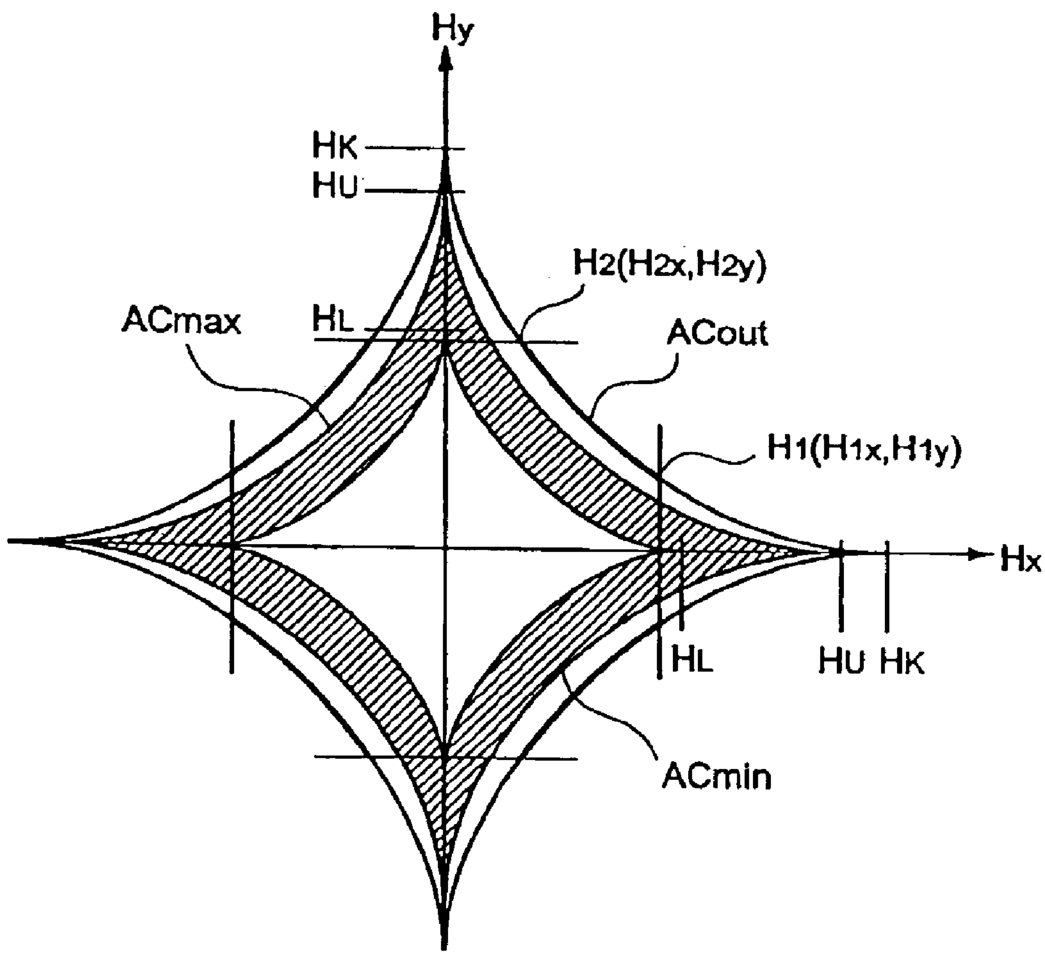
FIG. 1 shows the characteristics of magnetic fields that can switch the magnetization of the free layer of an MTJ device used in MRAMs and the setting of the magnetic fields for designing the MRAM to explain the methods for optimizing the write current in the MRAM according to an embodiment of the present invention.

An embodiment according to the present invention will now be explained in detail with reference to the accompanying drawings. In the drawings, like or corresponding components are assigned like reference numerals to avoid repeating the same description.

1. Preparation First, the description will be given of a precondition for optimizing a bit line write current and a word line write current according to the embodiment.

FIG. 1 shows asteroid curves in the embodiment according to the present invention. Referring to FIG. 1, the axis of abscissa indicates the bit line magnetic field $H_x$ generated by a write bit line current, while the axis of ordinate indicates a word line magnetic field $H_y$ generated by a write word line current.

Although the asteroid curve will vary, depending upon the locations of memory cells in an MRAM and variations in manufacturing conditions, it will generally remain within the hatched region shown in FIG. 1. A maximum asteroid curve $AC_{max}$ constituting the outer edge of the hatched region is given by expression (12) shown below, while a minimum asteroid curve $AC_{min}$ constituting the inner edge of the hatched region is given by expression (13) shown below.

[Expression 5]

$$H_x^{\frac{2}{3}} + H_y^{\frac{2}{3}} = H_U^{\frac{2}{3}} \tag{12}$$

$$H_x^{\frac{2}{3}} + H_y^{\frac{2}{3}} = H_L^{\frac{2}{3}} \tag{13}$$

Figure 3:
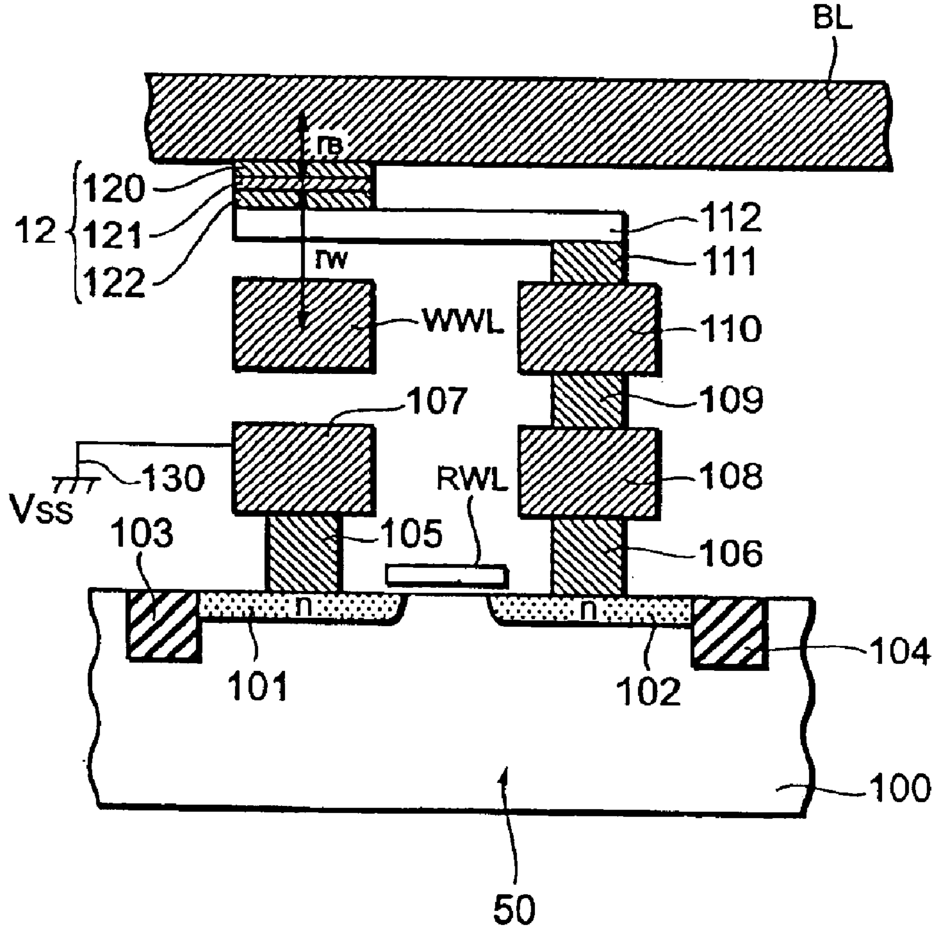
FIG. 3 is a sectional view showing an example of a construction of a memory cell of the MRAM (one transistor and one MTJ cell design)
Figure 4:
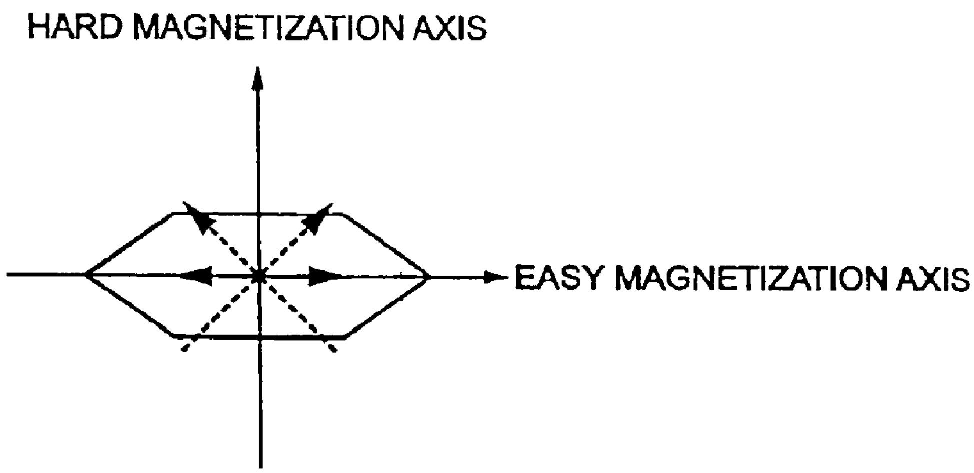
FIG. 4 illustrates the relationship of the easy magnetization axis and the hard magnetization axis to the free layer, and the switching of magnetization direction, of the free layer of the MTJ device shown in FIG. 3.
Figure 5:
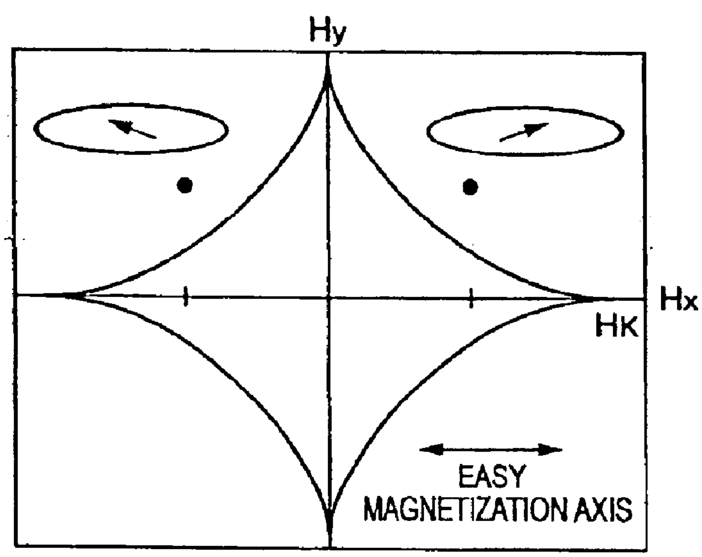
FIG. 5 illustrates the characteristics of the magnetic fields that can switch the magnetization direction of the free layer of the MTJ device shown in FIG. 3.
Figure 6:
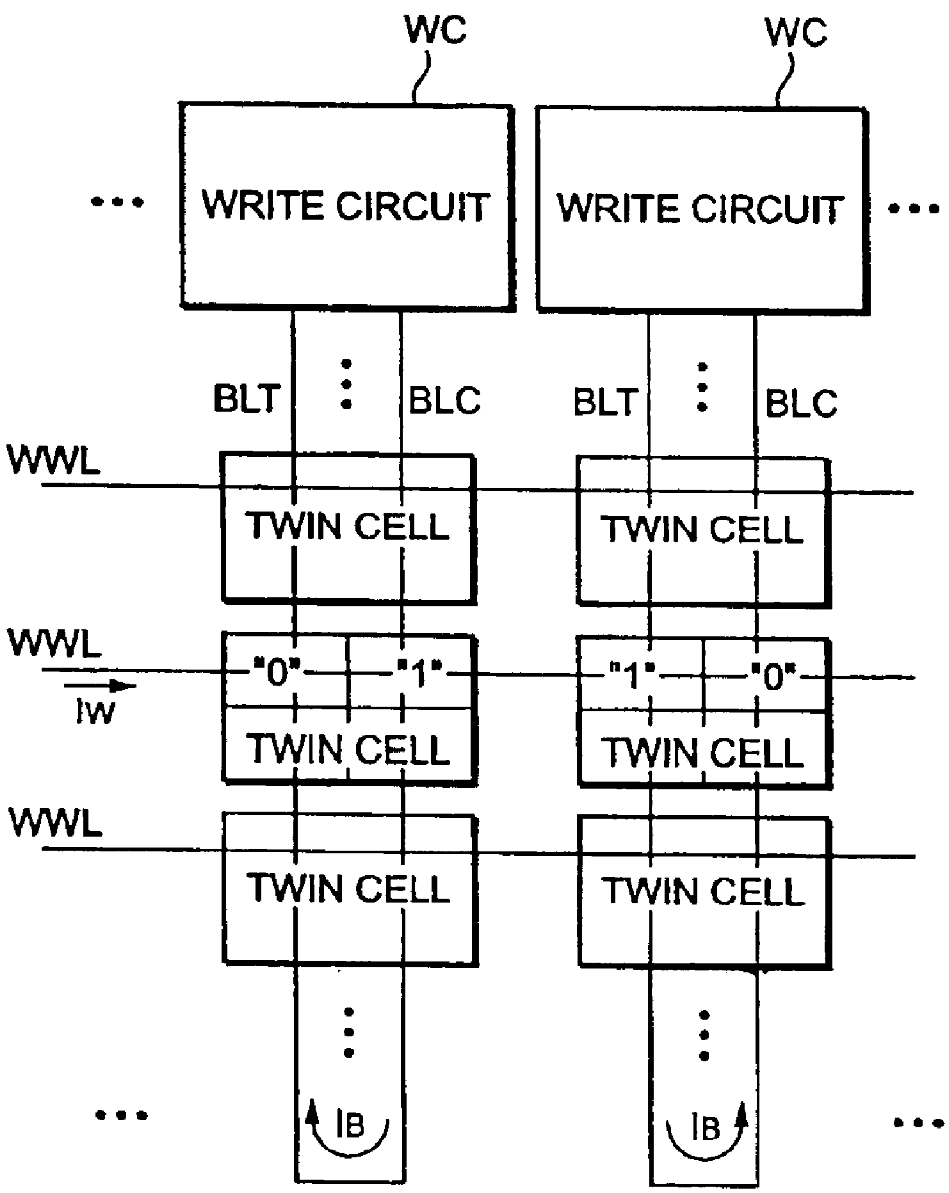
FIG. 6 is a functional block diagram showing the configuration of a twin-cell type MRAM.
Figure 7:
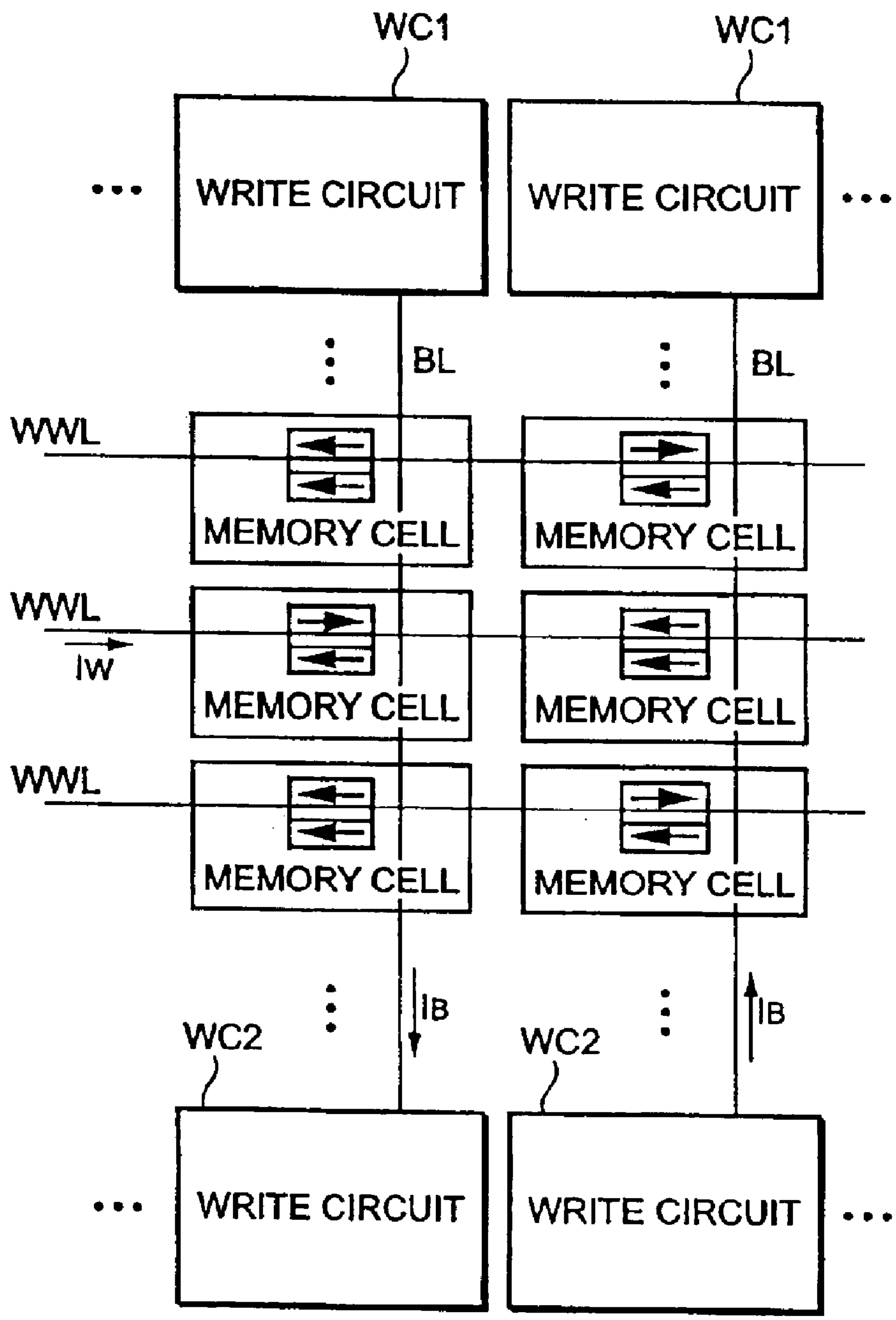
FIG. 7 is a functional block diagram showing a configuration of an MRAM using one transistor and one MTJ device type cells.

$H_U$ in expression (12) denotes the minimum bit line magnetic field that makes it possible to reverse the magnetization of a free layer 120 (refer to FIG. 3) in any one of memory cells associated with selected bit lines BL in the MRAM when $H_y$=0 or the minimum word line magnetic field that makes it possible to reverse the magnetization of the free layer 120 in any one of memory cells associated with a selected write word line WWL in the MRAM when $H_x$=0. $H_L$ in expression (13) denotes the maximum bit line magnetic field that makes it impossible to reverse the magnetization of the free layer 120 (see FIG. 3) in any one of memory cells associated with selected bit lines BL in the MRAM when $H_y$=0 or the maximum word line magnetic field that makes it impossible to reverse the magnetization of the free layer 120 in any one of memory cells associated with a selected write word line WWL in the MRAM when $H_x$=0.

2. Setting design conditions An asteroid curve $AC_{out}$ is defined with a predetermined design margin $m_1$ allowed between itself and a maximum asteroid curve $AC_{max}$ outside the hatched region. In this embodiment, the outermost asteroid curve (hereinafter referred to as "the outer asteroid curve") $AC_{out}$ will be used. The outer asteroid curve $AC_{out}$ is given by expression (14) shown below.

[Expression 6]

$$H_x^{\frac{2}{3}} + H_y^{\frac{2}{3}} = H_k^{\frac{2}{3}} \tag{14}$$

where $H_k$ denotes a predetermined constant and is given by expression (15) shown below when the predetermined design margin $m_1$ is used:

$$H_k = H_U + m_1 \tag{15}$$

It is necessary to restrict the bit line magnetic field $H_x$ and the word line magnetic field $H_y$ by expressions (16) and (17), respectively, shown below.

$$|H_x| \leqq H_{1x} \quad (16)$$

$$|H_y| \leqq H_{2Y} \quad (17)$$

where $H_{1x}$ and $H_{2Y}$ are defined by expressions (18) and (19) shown below by using predetermined design margins $m_2$ and $m_3$, respectively.

$$H_{1x} = H_L - m_2 \quad (18)$$

$$H_{2Y} = H_L - m_3 \quad (19)$$

If a bit line magnetic field $H_x$ that leads to $H_x > H_L$ is generated, then the magnetization direction of the free layer 120 in some memory cells will be changed merely by the bit line magnetic field $H_x$ regardless of the presence of the word line magnetic field $H_y$. In this case, therefore, the data of memory cells that have not been selected by a write word line WWL will be also rewritten in addition to that of the memory cells selected by the write word line WWL. This is referred to as multi-selection. To prevent the multi-selection, the bit line magnetic field $H_x$ and the word line magnetic field $H_y$ are restricted as shown by expressions (16) and (17), respectively, taking the design margins $m_2$ and $m_3$ into account.

Referring back to FIG. 1, a point $H_1$ on the outer asteroid curve $AC_{out}$ has its $H_x$ component of $H_{1x}$ and its $H_Y$ component of $H_{1Y}$. Similarly, a point $H_2$ has its $H_x$ component of $H_{2x}$ and its $H_Y$ component of $H_{2Y}$. Thus, a combination of an optimum write bit line current $I_B$ and an optimum write word line current $I_W$ are selected from among the combinations of the write bit line current $I_B$ and the write word line current $I_W$ for generating synthetic magnetic fields of the bit line magnetic field $H_x$ and the word line magnetic field $H_y$ lying on the curve between the point $H_1$ and the point $H_2$ on the outer asteroid curve $AC_{out}$.

The bit line magnetic field $H_x$ generated around a bit line BL when the write bit line current $I_B$ is passed through the bit line BL is given by expression (20) shown below.

[Expression 7]

$$H_x = a\frac{I_B}{r_B} \quad (20)$$

where denotes a predefined coefficient, and $r_B$ denotes the distance from the center of the cross-section of the bit line BL to the center of the cross-section of the free layer 120.

Similarly, the word line magnetic field $H_Y$ generated around a write word line WWL when the write word line current $I_W$ is passed through the write word line WWL is given by expression (21) shown below.

[Expression 8]

$$H_y = a\frac{I_W}{r_W} \quad (21)$$

where $r_W$ denotes the distance from the center of the cross-section of the write word line WWL to the center of the cross-section of the free layer 120.

To optimize the write bit line current $I_B$ and the write word line current $I_W$, expressions (14), (16), (17), (20) and (21) are used to minimize the write current obtained by adding the write word line current $I_W$ passing through a single selected write word line WWL and the write bit line currents $I_B$ passing through a plurality of bit lines BL crossing the selected write word line WWL, or to minimize the power consumed by the write word line current $I_W$ and the write bit line currents $I_B$.

The outer asteroid curve $AC_{out}$ is symmetrical with respect to the $H_X$ axis and the $H_Y$ axis; therefore, the minimum write current is calculated using the first quadrant thereof.

A constant $k_r$ is defined by expression (22) shown below:

$$k_r \equiv r_W / r_B \quad (22)$$

where $k_r$, $r_W$, $r_B \geqq 0$

Expression (23) is derived from expression (14) and expressions (20) through (22).

[Expression 9]

$$I_B^{\frac{2}{3}} + \left(\frac{I_W}{k_r}\right)^{\frac{2}{3}} = \left(\frac{r_B}{a}\right)^{\frac{2}{3}} H_k^{\frac{2}{3}} = I_{B0}^{\frac{2}{3}} = \left(\frac{I_{W0}}{k_r}\right)^{\frac{2}{3}} \quad (23)$$

$I_{B0}$ denotes the write bit line current when $I_W=0$ and is defined by expression (24) shown below:

$$I_{B0} = (r_B/a)H_k \quad (24)$$

$I_{W0}$ denotes the write word line current when $I_B=0$ and is defined by expression (25) shown below:

$$I_{W0} = (r_W/a)H_k \quad (25)$$

Therefore, expression (26) shown below applies to the relationship between $I_{B0}$ and $I_{W0}$:

$$I_{WO} = k_r I_{B0} \quad (26)$$

Meanwhile, from expressions (16) and (17), the bit line magnetic field $H_x$ and the word line magnetic field $H_y$ are subjected to the restrictions given by expressions (27) and (28) shown below:

$$H_{2x} \leqq H_x \leqq H_{1x} \quad (27)$$

$$H_{1y} \leqq H_y \leqq H_{2y} \quad (2\ 8)$$

If the write bit line current at $H_1$ in FIG. 1 is denoted as $I_{B1}$ and the write word line current at $H_1$ is denoted as $I_{W1}$, while the write word line current at $H_2$ in FIG. 1 is denoted as $I_{W2}$ and the write bit line current at $H_2$ is denoted as $I_{B2}$, then the currents $I_{B1}$, $I_{W1}$, $I_{W2}$ and $I_{B2}$ will be defined by expressions (29) through (32), respectively, as shown below:

[Expression 10]

$$I_{B1} \equiv \frac{r_B}{a} H_{1x} \quad (29)$$

$$I_{W1} \equiv k_r\left(I_{B0}^{\frac{2}{3}} - I_{B1}^{\frac{2}{3}}\right)^{\frac{2}{3}} = \frac{r_W}{a}\left(H_k^{\frac{2}{3}} - H_{1x}^{\frac{2}{3}}\right)^{\frac{2}{3}} = \frac{r_W}{a} H_{1y} \quad (30)$$

$$I_{W2} \equiv \frac{r_W}{a} H_{2y} \quad (31)$$

$$I_{B2} \equiv \left\{I_{B0}^{\frac{2}{3}} - \left(\frac{I_{W2}}{k_r}\right)^{\frac{2}{3}}\right\}^{\frac{2}{3}} = \frac{r_B}{a}\left(H_k^{\frac{2}{3}} - H_{2y}^{\frac{2}{3}}\right)^{\frac{2}{3}} = \frac{r_B}{a} H_{2x} \quad (32)$$

As is obvious from FIG. 1, relations expressed as $0 < I_{B2} < I_{B1} < I_{B0}$ and $0 < I_{W1} < I_{W2} < I_{W0}$ hold.

From expressions (27) through (32), the write bit line current $I_B$ and the write word line current $I_W$ are required to satisfy expressions (33) and (34) shown below:

$$I_{B2} \leqq I_B \leqq I_{B1} \quad (33)$$

$$I_{W1} \leqq I_W \leqq I_{W2} \quad (34)$$

3. Method for Optimization by Minimizing Write Current

The description will now be given of a method for optimizing the write bit line current $I_B$ and the write word line current $I_W$ by minimizing the write current obtained by adding the write bit line currents $I_B$ and the write word line current $I_W$ under the precondition described above.

The write current $I_T$ passing in the write operation is given by expression (35) shown below:

$$I_T = nI_B + I_W \tag{35}$$

Accordingly, a combination of the write bit line current $I_B$ and the write word line current $I_W$ that minimizes the write current $I_T$ is selected from among the combinations of the write bit line current $I_B$ and the write word line current $I_W$ that satisfy both expressions (23) and (35). The selected combination indicates optimum write bit line current $I_B$ and the write word line current $I_W$. Expression (36) shown below is derived from expressions (23) and (35):

[Expression 11]

$$I_T = n\ I_B + k_r\left(I_{BO}^{\frac{2}{3}} - I_B^{\frac{2}{3}}\right)^{\frac{2}{3}} = \frac{n}{k_r}\left(I_{WO}^{\frac{2}{3}} - I_W^{\frac{2}{3}}\right)^{\frac{3}{2}} + I_W \tag{36}$$

Based on expression (36), $d^2I_T/dI^2_B>0$ in a region defined by $0<I_B<I_{BO}$; therefore, the write current $I_T$ is a convex function of the bit line current $I_B$ in the above region. Accordingly, the write current $I_T$ takes a local minimum value when $dI_T/dI_B=0$. Hereinafter, the write bit line current $I_B$ that gives the local minimum value of $I_T$ will be denoted by $I_{BTmin}$.

3.1. Case Where $I_{B2}<I_{BTmin}<I_{B1}$

If $I_{B2}<I_{BTmin}<I_{B1}$, then $I_{BTmin}$ is given by expression (37) shown below.

[Expression 12]

$$I_{BT\min} = \frac{k_r^3}{(n^2+k_r^2)^{\frac{3}{2}}} I_{BO} = \frac{r_W^3}{(n^2r_B^2+r_W^2)^{\frac{3}{2}}} I_{BO} = \frac{r_B r_W^3}{a\ (n^2r_B^2+r_W^2)^{\frac{3}{2}}} H_k \tag{37}$$

From expression (23), the write word line current $I_{WTmin}$ that gives the local minimum value in this case is given by expression (38) shown below.

[Expression 13]

$$\begin{aligned} I_{WT\min} &= \frac{n^3k_r}{(n^2+k_r^2)^{\frac{3}{2}}} I_{BO} = \frac{n^3r_B^2r_W}{(n^2r_B^2+r_W^2)^{\frac{3}{2}}} I_{BO} \\ &= \frac{n^3}{(n^2+k_r^2)^{\frac{3}{2}}} I_{WO} = \frac{n^3r_B^3}{(n^2r_B^2+r_W^2)^{\frac{3}{2}}} I_{WO} \\ &= \frac{n^3r_B^3+r_W}{a\ (n^2r_B^2+r_W^2)^{\frac{3}{2}}} H_k \end{aligned} \tag{38}$$

Based on expressions (35), (37) and (38), the minimum write current $I_{Tmin}$ in this case is given by expression (39) shown below.

[Expression 14]

$$\begin{aligned} I_{T\min} &= \frac{n\ k_r}{\sqrt{n^2+k_r^2}} I_{BO} = \frac{n\ r_W}{\sqrt{n^2r_B^2+r_W^2}} I_{BO} \\ &= \frac{n}{\sqrt{n^2+k_r^2}} I_{WO} = \frac{n\ r_B}{\sqrt{n^2r_B^2+r_W^2}} I_{WO} \end{aligned} \tag{39}$$

-continued $$= \frac{n\ r_B r_W}{a\sqrt{n^2r_B^2+r_W^2}} H_k$$

In this case, $I_{BTmin}$ is determined as the optimum write bit line current, while $I_{WTmin}$ is determined as the optimum write word line current.

3.2. Case Where $I_{BTmin}>I_{B1}$

If $I_{BTmin}>I_{B1}$, then the write current $I_T$ takes a minimum value in the region wherein the write bit line current $I_B$ is larger than $I_{B1}$. Based on expression (33), the write bit line current $I_B$ must be $I_{B1}$ or less; therefore, the write bit line current $I_B$ that minimizes the write current $I_T$ is $I_{B1}$. Hence, the minimum write current $I_{Tmin}$ in this case is given by expression (40) shown below.

[Expression 15]

$$I_{Tmin} = nI_{B1} + I_{W1} = 1/a(nr_BH_{1x} + r_WH_{1y}) \tag{40}$$

In this case $I_{B1}$ is determined as the optimum write bit line current, while $I_{W1}$ is determined as the optimum write word line current.

3.3. Case Where $I_{BTmin}<I_{B2}$

If $I_{BTmin}<I_{B2}$, then the write current $I_T$ takes a minimum value in the region wherein the write bit line current $I_B$ is smaller than $I_{B2}$. Based on expression (33), the write bit line current $I_B$ must be $I_{B2}$ or more. Therefore, the write bit line current $I_B$ for minimizing the write current $I_T$ in this case is $I_{B2}$. Hence, the minimum write current $I_{Tmin}$ in this case is given by expression (41) shown below:

[Expression 16]

$$I_{Tmin} = nI_{B2} + I_{W2} = 1/a(n\ r_BH_{2x} + r_WH_{2y}) \tag{41}$$

In this case, $I_{B2}$ is determined as the optimum write bit line current, while $I_{W2}$ is determined as the optimum write word line current.

Thus, according to this embodiment, if n, $r_B$ and $r_W$ are given, and $H_k$, $H_{1x}$ and $H_{2y}$ are determined, then the optimum write bit line current $I_B$ and optimum word line current $I_W$ for minimizing the write current IT can be determined.

3.4. Example of Calculation

Table 1 shows an example in which the write bit line current and the write word line current are optimized for minimizing write current when n and $k_r(=r_W/r_B)$ take different predetermined values.

TABLE 1

| n | $k_r$ | $I_{BTmin}/I_{B0}$ | $I_{WTmin}/I_{B0}$ | $I_{WTmin}/I_{W0}$ | $I_{Tmin}/I_{B0}$ | $I_{Tmin}/I_{W0}$ | $I_{Tmin}/I_{W0}$ |
|---|---|---|---|---|---|---|---|
| 1 | 1.0 | 0.354 | 0.354 | 0.354 | 0.707 | 0.707 | — |
| 4 | 5.0 | 0.476 | 1.22 | 0.244 | 3.12 | 0.625 | — |
| 8 | 5.0 | 0.149 | 3.05 | 0.610 | 4.24 | 0.848 | — |
| 4 | 10.0 | 0.800 | 0.512 | 0.0512 | 3.71 | 0.371 | 0.385 (*1) |
| 8 | 10.0 | 0.476 | 2.44 | 0.244 | 6.25 | 0.625 | — |
| 16 | 10.0 | 0.149 | 6.10 | 0.610 | 8.48 | 0.848 | — |
| 32 | 10.0 | 0.0265 | 8.70 | 0.870 | 9.54 | 0.954 | 1.05 (*2) |
| 8 | 15.0 | 0.687 | 1.56 | 0.104 | 7.06 | 0.471 | 0.471 (*1) |
| 16 | 15.0 | 0.320 | 5.82 | 0.388 | 10.9 | 0.730 | — |
| 32 | 15.0 | 0.0765 | 11.1 | 0.742 | 13.6 | 0.905 | 0.916 (*2) |
| 8 | 20.0 | 0.800 | 1.02 | 0.0512 | 7.43 | 0.371 | 0.385 (*1) |
| 16 | 20.0 | 0.476 | 4.88 | 0.244 | 12.5 | 0.625 | — |
| 32 | 20.0 | 0.149 | 12.2 | 0.610 | 17.0 | 0.848 | — |
| 64 | 20.0 | 0.0265 | 17.4 | 0.870 | 19.1 | 0.954 | 1.05 (*2) |

If $r_B$ takes a fixed value, then $I_{B0}$ also takes a fixed value. Thus, $I_{BTmin}$, $I_{WTmin}$ and $I_{Tmin}$ can be calculated on the basis of comparison with $I_{B0}$. Similarly, if $r_W$ takes a fixed value, the $I_{W0}$ also takes a fixed value. Thus, $I_{WTmin}$ and $I_{Tmin}$ can be calculated on the basis of comparison with $I_{W0}$.

Referring to Table 1, $I_{BTmin}/I_{B0}$ is given by expression (37). $I_{WTmin}/I_{B0}$ and $I_{WTmin}/I_{W0}$ are given by expression (38). $I_{Tmin}/I_{B0}$ and $I_{Tmin}/I_{W0}$ are given by expression (39). $I_{Tmin}/I_{W0}$ in the rightmost column is given by expression (40) or (41).

In the rightmost column of Table 1, it is assumed that $H_{1x}=H_{2y}=0.65\times H_k(I_{B1}=0.65\times I_{B0},\ I_{B2}=0.125\times I_{B0})$. In the column, (*1) indicates the value of $I_{Tmin}/I_{W0}$ when $I_B=I_{B1}$, because $I_{BTmin}>I_{B1}$ for these rows. Furthermore, (*2) indicates the value of $I_{Tmin}/I_{W0}$ when $I_B=I_{B2}$, because $I_{BTmin}<I_{B2}$ for the rows.

4. Optimizing Method by Minimizing Write Power

As another alternative method, the write bit line current $I_B$ and the write word line current $I_W$ may be optimized by minimizing power consumption in write operations (hereinafter referred to as gwrite power h) in place of the above write current $I_T$.

Write power $P_d$ due to parasitic resistance of the write word line WWL L is given by expression (42) shown below:

[Expression 17]

$$P_d=nI_B^2R_B+I_W^2R_W \tag{42}$$

where $R_B$ denotes a parasitic resistance of the bit line BL, and $R_W$ denotes a parasitic resistance of the write word line WWL.

For the convenience of calculation, $k_R$ is defined as $k_R=R_W/R_B$, and $R_W$ and $P_d$ of expression (42) is normalized by $R_B$. The normalized write power P is defined by expression (43) shown below:

[Expression 18]

$$P\equiv\frac{P_d}{R_B}=n\,I_B^2+k_RI_W^2 \tag{43}$$

Deleting $I_W$ from expression (43) by using expression (23) leads to expression (44) shown below;

[Expression 19]

$$\begin{aligned}P&=n\,I_B^2+k_r^2k_R\left(I_{B0}^{\frac{2}{3}}-I_B^{\frac{2}{3}}\right)^3\\&=(n-k_r^2k_R)I_B^2+3k_r^2k_RI_{B0}^{\frac{2}{3}}I_B^{\frac{4}{3}}-3k_r^2k_RI_{B0}^{\frac{4}{3}}I_B^{\frac{2}{3}}+\\&\quad k_r^2k_RI_{B0}^2\end{aligned} \tag{44}$$

The value of $I_B$ that gives the local extreme values of P can be obtained by solving $dP/dI_B=0$. The value of $I_B$ is given by expression (45) when $n-k_r^2k_R$¹0:

[Expression 20]

$$I_B=\left\{\frac{-k_r\left(k_rk_R\pm\sqrt{n\,k_R}\right)}{n-k_r^2k_R}\right\}^{\frac{3}{2}}I_{B0} \tag{45}$$

When $n-k_r^2k_R$¹0, P may be regarded as a cubic function of $I_B^{2/3}$.$I_B^{2/3}$ is a monotone increasing function of $I_B$ in the region of interest. In the vicinity of local extreme values, therefore, it may be said that the behavior of P as the function of $I_B$ is similar to the behavior of P as the function of $I_B^{2/3}$.

In the vicinity of the values of $I_B$ given by expression (45), P behaves as a cubic function of $I_B^{2/3}$ as shown in expression (44). If $n-k_r^2k_R<0$, then $k_rk_R-(nk_R)^{1/2}>0$; therefore, the value $I_{BPmin}$ that is the smaller value of $I_B$ given by expression (45) is given by expression (46) shown below. This $I_{BPmin}$ value is a candidate of the bit line current for minimizing the normalized write power P and eventually the write power $P_d$.

[Expression 21]

$$\begin{aligned}I_{BPmin}&=\left(\frac{k_r\sqrt{k_R}}{\sqrt{n}+k_r\sqrt{k_R}}\right)^{\frac{3}{2}}I_{B0}\\&=\left(\frac{r_W\sqrt{R_W}}{r_B\sqrt{nR_B}+r_W\sqrt{R_W}}\right)^{\frac{3}{2}}I_{B0}\\&=\left(\frac{r_W\sqrt{R_W}}{r_B\sqrt{n\,R_B}+r_W\sqrt{R_W}}\right)^{\frac{3}{2}}\frac{r_B}{a}H_k\end{aligned} \tag{46}$$

If $n-k_r^2k_R>0$, then a value that is the larger value of $I_B$ given by expression (45) provides a candidate of the write bit line current for minimizing the write power $P_d$ and is also given by expression (46).

4.1. Case Where $I_{B2}$£$I_{BPmin}$£$I_{B1}$

Because $d^2P/dI_B^2>0$ in the region of $0<I_B<I_{B0}$, both P and $P_d$ are convex functions in the region. Hence, if $I_{B2}$£$I_{BPmin}$£$I_{B1}$, then $P_d$ takes a minimum value at $I_{BPmin}$ given by expression (46). The minimum power consumption $P_{dmin}$ is given by expression (47) shown below by substituting (46) for $I_B$ in expression (44).

[Expression 22]

$$\begin{aligned}P_{dmin}&=R_BI_{B0}^2\frac{n\,k_r^2k_R}{\left(\sqrt{n}+k_r\sqrt{k_R}\right)^2}=\frac{n\,r_W^2R_BR_W}{\left(r_B\sqrt{n\,R_B}+r_W\sqrt{R_W}\right)^2}I_{B0}^2\\&=R_WI_{W0}^2\frac{n}{\left(\sqrt{n}+k_r\sqrt{k_R}\right)^2}=\frac{n\,r_B^2R_BR_W}{\left(r_B\sqrt{n\,R_B}+r_W\sqrt{R_W}\right)^2}I_{W0}^2\\&=\frac{n\,r_B^2r_W^2R_BR_W}{a^2\left(r_B\sqrt{n\,R_B}+r_W\sqrt{R_W}\right)^2}H_k^2\end{aligned} \tag{47}$$

The write word line current $I_{WPmin}$ for the minimum power consumption $P_{dmin}$ is given by expression (48) shown below from expressions (23) and (46):

[Expression 23]

$$\begin{aligned}I_{WPmin}&=k_r\left(\frac{\sqrt{n}}{\sqrt{n}+k_r\sqrt{k_R}}\right)^{\frac{3}{2}}I_{B0}=\frac{r_W}{r_B}\left(\frac{r_B\sqrt{n\,R_B}}{r_B\sqrt{n\,R_B}+r_W\sqrt{R_W}}\right)^{\frac{3}{2}}I_{B0}\\&=\left(\frac{\sqrt{n}}{\sqrt{n}+k_r\sqrt{k_R}}\right)^{\frac{3}{2}}I_{W0}=\left(\frac{r_B\sqrt{n\,R_B}}{r_B\sqrt{n\,R_B}+r_W\sqrt{R_W}}\right)^{\frac{3}{2}}I_{W0}\\&=\left(\frac{r_B\sqrt{n\,R_B}}{r_B\sqrt{n\,R_B}+r_W\sqrt{R_W}}\right)^{\frac{3}{2}}\frac{r_W}{a}H_k\end{aligned} \tag{48}$$

If $n-k_r^2k_R=0$, then P in expression (44) reduces to a quadratic function of $I_B^{2/3}$. This quadratic function is also a convex function, so that $P_d$ takes a minimum value $P_{dmin}$ at $I_{BPmin}$ and $I_{WPmin}$. $P_{dmin}$, $I_{BPmin}$ and $I_{WPmin}$ are given by expressions (49) through (51), respectively, shown below:

In this case, $I_{BPmin}$ is determined as the optimum write bit line current, while $I_{WPmin}$ is determined as the optimum write word line current.

[Expression 24]

$$P_{d\min} = \frac{n}{4} I_{B0}^2 R_B = \frac{1}{4} I_{W0}^2 R_W \tag{49}$$

$$I_{BP\min} = \frac{I_{B0}}{2\sqrt{2}} \tag{50}$$

$$I_{WP\min} = \frac{I_{W0}}{2\sqrt{2}} \tag{51}$$

4.2. Case Where $I_{BPmin} > I_{b1}$

Independently of the value of $n-k_r^2 k_R$, $P_d$ is a convex function of $I_B$ in the region defined by $0<I_B<I_{B0}$. If $I_{BTmin}>I_{B1}$, then the write power $P_d$ takes a minimum local value $P_{dmin}$ in the region wherein the write bit line current $I_B$ is larger than $I_{B1}$. Based on expression (33), the write bit line current $I_B$ must be $I_{B1}$ or less; hence, the write bit line current $I_B$ for minimizing the write power $P_d$ in this case is $I_{B1}$. Thus, the minimum write power $P_{dmin}$ in this case is given by expression (52) shown below:

[Expression 25]

$$P_{dmin} = nI_{B1}^2 R_B + I_{W1}^2 R_W \tag{52}$$

In this case, $I_{B1}$ is determined as the optimum write bit line current, while $I_{W1}$ is determined as the optimum write word line current.

4.3. Case Where $I_{BPmin} < I_{B2}$

If $I_{BPmin}<I_{B2}$, then the write power $P_d$ takes a local minimum value $P_{dmin}$ in the region wherein the write bit line current $I_B$ is smaller than $I_{B2}$. Based on expression (33), the write bit line current $I_B$ must be $I_{B2}$ or more. In this case, therefore, the write bit line current $I_B$ for minimizing the write power $P_d$ is $I_{B2}$. Hence, the minimum write power $P_{dmin}$ in this case is given by expression (53) shown below:

[Expression 26]

$$P_{dmin} = nI_{B2}^2 R_B + I_{W2}^2 R_W \tag{53}$$

In this case, $I_{B2}$ is determined as the optimum write bit line current, while $I_{W2}$ is determined as the optimum write word line current.

4.4. Example of Calculation

Table 2 shows an example in which the write bit line current and the write word line current are optimized for minimizing write power when n, $k_R$ and $k_r$ respectively take different predetermined values.

TABLE 2

| n | $k_R$ | $k_r$ | $I_{BPmin}/I_{B0}$ | $I_{WPmin}/I_{B0}$ | $I_{WPmin}/I_{W0}$ | $P_{dmin}/(I_{B0}^2R_B)$ | $P_{dmin}/(I_{W0}^2R_W)$ | $P_{dmin}/(I_{W0}^2R_W)$ |
|---|---|---|---|---|---|---|---|---|
| 1 | 1 | 1 | 0.354 | 0.354 | 0.354 | 0.250 | 0.250 | — |
| 128 | 1 | 5 | 0.170 | 2.89 | 0.578 | 12.0 | 0.481 | — |
| 256 | 1 | 5 | 0.116 | 3.33 | 0.665 | 14.5 | 0.580 | 0.582 (*2) |
| 8 | 1 | 10 | 0.688 | 1.04 | 0.104 | 4.86 | 0.0486 | 0.0494 (*1) |
| 16 | 1 | 10 | 0.604 | 1.53 | 0.153 | 8.16 | 0.0816 | — |
| 64 | 1 | 10 | 0.414 | 2.96 | 0.296 | 19.8 | 0.198 | — |
| 256 | 1 | 10 | 0.239 | 4.83 | 0.483 | 37.9 | 0.379 | — |
| 32 | 2 | 15 | 0.701 | 1.45 | 0.0966 | 19.9 | 0.0443 | 0.0456 (*1) |
| 64 | 2 | 15 | 0.619 | 2.15 | 0.143 | 33.7 | 0.0750 | — |
| 256 | 2 | 15 | 0.430 | 4.23 | 0.282 | 83.2 | 0.185 | — |
| 64 | 1 | 20 | 0.604 | 3.05 | 0.153 | 32.7 | 0.0816 | — |
| 128 | 4 | 20 | 0.688 | 2.07 | 0.104 | 77.8 | 0.0486 | 0.0494 (*1) |
| 256 | 4 | 20 | 0.604 | 3.05 | 0.153 | 131 | 0.0816 | — |

Referring to Table 2, $I_{BPmin}/I_{B0}$ is given by expression (46). $I_{WPmin}/I_{B0}$ and $I_{WPmin}/I_{W0}$ are given by expression (48). $P_{dmin}/(I_{B0}^2R_B)$ and $P_{dmin}/(I_{W0}^2R_W)$ are given by expression (47). $P_{dmin}/(I_{W0}^2R_W)$ in the rightmost column is given by expression (52) or (53).

In the rightmost column of Table 2, it is assumed that $H_{1x}=H_{2y}=0.65\times H_k (I_{B1}=0.65\times I_{B0},\ I_{B2}=0.125\times I_{B0})$, as in Table 1 above. In the column, (*1) indicates the value of $P_{dmin}/(I_{W0}^2R_W)$ when $I_B=I_{B1}$, because $I_{BTmin}>I_{B1}$ for these rows. Furthermore, (*2) indicates the value of $P_{dmin}/(I_{W0}^2R_W)$ when $I_B=I_{B2}$, because $I_{BTmin}<I_{B2}$ for the rows.

Thus, according to the embodiment, optimum write bit line current $I_{BTmin}$ and write word line current $I_{WTmin}$ can be determined on the basis of the asteroid curve. More specifically, to suppress the occurrence of noise or to minimize the load on a power circuit, optimum write bit line current $I_{BTmin}$ and write word line current $I_{WTmin}$ can be determined so as to minimize the write current $I_T$. To restrain heat generation, optimum write bit line current $I_{BPmin}$ and write word line current $I_{WPmin}$ can be determined so as to minimize the write power $P_d$.

5. Write Current Control Circuit

Figure 2:
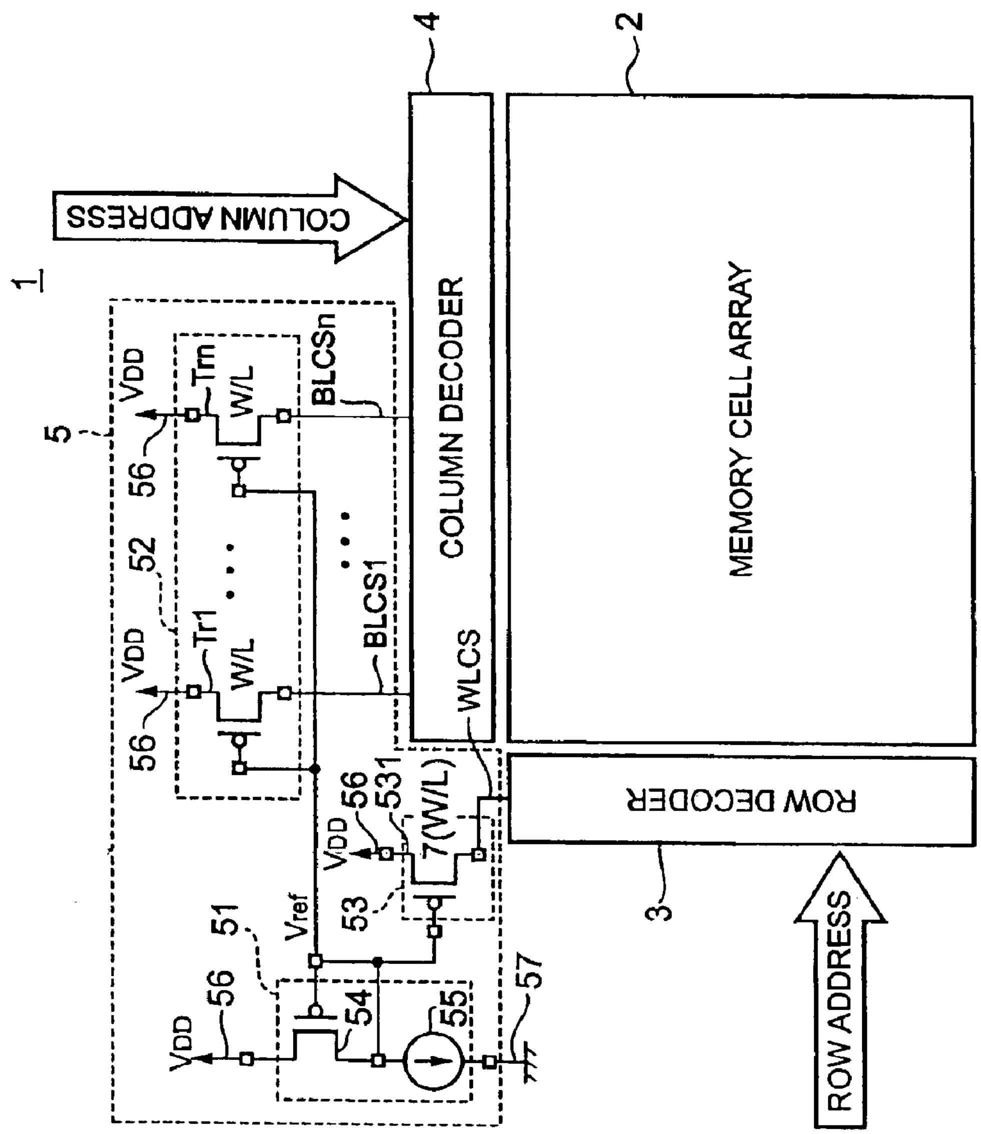
FIG. 2 is a functional block diagram showing a structure of the MRAM according to an embodiment of the present invention.

FIG. 2 is a functional block diagram showing the structure of an MRAM according to an embodiment of the present invention. Referring to FIG. 2, MRAM1 includes a memory cell array 2, a row decoder 3, a column decoder 4 and a write current control circuit 5.

A row decoder 3 receives a row address signal input from an outside source and selects a single write or read word line from a plurality of write or read word lines. A column decoder 4 receives a column address signal input from an outside source and selects one or more bit lines from a plurality of bit lines. The write current control circuit 4 controls the write word line current supplied to the word line selected by the row decoder 3 and also controls the write bit line current or currents supplied to the bit line or bit lines selected by the column decoder 4.

The write current control circuit 4 includes a reference potential generating circuit 51, a write bit line current control circuit 52 and a write word line current control circuit 53. The reference potential generating circuit 51 includes a P-channel MOS transistor 54 and a constant-current source 55. The P-channel MOS transistor 54 and the constant-current source 55 are connected in series between a power source potential (VDD) node 56 and a ground potential node 57, the P-channel MOS transistor 54 being diode-connected. The reference potential generating circuit 51 generates a reference potential Vref and supplies the reference potential Vref to both the write bit line current control circuit 52 and the write word line current control circuit 53.

The write bit line current control circuit 52 has a plurality of P-channel MOS transistors Tr1 through Trn (n being a natural number). The sources of the P-channel MOS transistors Tr1 through Trn are connected to the power source potential node 56, and the drains thereof are connected to bit line current supply source lines BLCS1 through BLCSn, respectively. The reference potential Vref is commonly supplied from the reference potential generating circuit 51 to the gates of the P-channel MOS transistors Tr1 through Trn.

The write word line current control circuit 53 has a P-channel MOS transistor 531. The source of the P-channel MOS transistor 531 is connected to the power source potential node 56, and the drain thereof is connected to a write word line current supply source line WLCS. The reference potential Vref is supplied from the reference potential generating circuit 51 to the gate of the P-channel MOS transistor 531.

Thus, the write bit line current control circuit 52 controls the write bit line currents according to the reference potential Vref, while the write word line current control circuit 53 controls the write word line current according to the same reference potential Vref. Thus, as the reference potential Vref increases, the write bit line current and the write word line current both decrease, whereas the write bit line current and the write word line current both increase as the reference potential Vref decreases. This means that the write bit line current and the write word line current change in the same direction and in a mutually interlocked manner.

Here, the channel width/channel length (W/L) of the P-channel MOS transistors Tr1 through Trn in the write bit line current control circuit 52 and that of the P-channel MOS transistor 531 in the write word line current control circuit 53 are determined as described below.

The optimum write bit line current $I_B$ and the optimum write word line current $I_W$ that pass in the write operations are determined according to the write current optimizing method described before. Hence, the bit line write current control circuit 52 must supply the optimum write bit line current $I_B$ to each bit line and also supply the optimum write word line current $I_W$ to the selected word line. The same reference potential Vref is supplied to the write bit line current control circuit 52 and the write word line current control circuit 53. Thus, the W/L values are set such that those of the P-channel MOS transistors Tr1 through Trn are different from that of the P-channel MOS transistor 531, thereby supplying optimum write bit line current $I_B$ and the write word line current $I_W$.

More specifically, the W/L ratio of the P-channel MOS transistors Tr1 through Trn to the P-channel MOS transistor 531 is set to be substantially equal to the ratio of the optimum write bit line current $I_B$ to the optimum write word line current $I_W$. In Table 1, for example, if n=8 and $k_r$=10.0, then $I_{BTmin}/I_{B0}$=0.476 and $I_{WTmin}/I_{B0}$=2.44. Hence, the W/L of the P-channel MOS transistors Tr1 through Trn and the W/L of the P-channel MOS transistor 531 are set such that the aforesaid W/L ratio is 0.476/2.44.

As described above, the write current control circuit 5 according to the embodiment controls the write bit line current and the write word line current on the basis of the same reference potential Vref, permitting the ratio thereof to remain constant.

The reference potential Vref can be adjusted by adjusting the current value of the constant-current source 55. This makes it possible to set the absolute values of the write bit line current and the write word line current at appropriate values.

While an embodiment of the present invention has been described, the aforesaid embodiment is merely an example for embodying the invention. It is to be understood, therefore, that the invention is not limited to the disclosed embodiment. On the contrary, the invention is intended to cover various modifications and equivalent arrangements included within the spirit and scope of the invention.

What is claimed is:

1. A magnetic memory comprising:

a plurality of bit lines;

a plurality of word lines crossing the bit lines;

a plurality of magnetic memory elements disposed at intersections of the bit lines and the word lines, each of the memory cells comprising a free layer with reversible magnetization and a pinned layer with fixed magnetization;

a reference potential generating circuit configured to generate a predetermined reference potential;

a write bit line current controlling circuit configured to control write bit line current passing through the bit lines in a write operation on the basis of a reference potential generated by the reference potential generating means; and a write word line current controlling circuit configured to control write word line current passing through the word lines in the write operation on the basis of a reference potential generated by the reference potential generating circuit.

2. The magnetic memory of claim 1, wherein the write bit line current controlling circuit includes a first transistor having a gate for receiving the reference potential to pass the write bit line current, and the write word line current controlling circuit includes a second transistor having a gate for receiving the reference potential to pass the write word line current.

3. The magnetic memory of claim 2, wherein a ratio of a channel width/channel length of the first transistor to a channel width/channel length of the second transistor is set to be substantially equal to a ratio of the write bit line current to the write word line current.

4. The magnetic memory of claim 1, wherein the write bit line current is optimized.

5. The magnetic memory of claim 1, wherein the write bit line current is optimized by:

determining a distance $r_B$ from the bit lines to the free layers, a distance $r_W$ from the word lines to the free layers, and a number n of the bit lines through which write bit line current $I_B$ passes in a write operation; and determining the write bit line current $I_B$ and the write word line current $I_W$ so as to minimize the write current $I_T$ by using expression (1) representing an asteroid curve expressed by a bit line magnetic field $H_x$ generated by the bit line current $I_B$, a word line magnetic field $H_y$ generated by the write word line current $I_W$ passing through the word lines in the write operation, and a predetermined constant $H_K$, expression (2) representing write current $I_T$ obtained by adding the write bit line current $I_B$ and the write word line current $I_W$, expression (3) representing the bit line magnetic field $H_x$ generated by the bit line current $I_B$ by using a predetermined coefficient a, and expression (4) representing the word line magnetic field $H_y$ generated by the word line current $I_W$ by using the predetermined coefficient a:

$$H_x^{\frac{2}{3}} + H_y^{\frac{2}{3}} = H_k^{\frac{2}{3}} \quad (1)$$

$$I_T = n I_B + I_W \quad (2)$$

$$H_x = a\frac{I_B}{r_B} \quad (3)$$

$$H_y = a\frac{I_W}{r_W}. \quad (4)$$

6. The magnetic memory of claim 5, wherein the constant $H_K$ is given by expression (5) using a predetermined design margin $m_1$ when a minimum bit line magnetic field that makes it possible to reverse the magnetization of the free layers in any one of the memory cells associated with the bit line through which the write bit line current $I_B$ passes when $H_y=0$ or a minimum word line magnetic field that makes it possible to reverse the magnetization of the free layers in any one of the memory cells associated with a word line through which the write word line current $I_W$ passes when $H_x=0$ is denoted as $H_U$:

$$H_K=H_U+m_1 \quad (5).$$

7. The magnetic memory of claim 6, wherein the constant $H_K$ is given by expression (5) using a predetermined design margin $m_1$ when a minimum bit line magnetic field that makes it possible to reverse the magnetization of the free layers in any one of the memory cells associated with the bit line through which the write bit line current $I_B$ passes when $H_y=0$ or a minimum word line magnetic field that makes it possible to reverse the magnetization of the free layers in any one of the memory cells associated with a word line through which the write word line current $I_W$ passes when $H_x=0$ is denoted as $H_U$:

$$H_K=H_U+m_1 \quad (5).$$

8. The magnetic memory of claim 7, wherein the bit line magnetic field $H_x$ and the word line magnetic field $H_y$ are given by expressions (6) and (7) using predetermined design margins $m_2$ and $m_3$, respectively, when a maximum bit line magnetic field that makes it impossible to reverse the magnetization of the free layers in any one of the memory cells when $H_y=0$ or a maximum word line magnetic field that makes it impossible to reverse the magnetization of the free layers in any one of the memory cells when $H_x=0$ is denoted as $H_L$ where:

$$|H_y| \leqq H_{2Y}=H_L-m_3 \quad (6)$$

$$|H_x| \leqq H_{1x}=H_L-m_2 \quad (7).$$

9. A method for providing an optimized write current in a magnetic memory, the method comprising:

providing a plurality of bit lines;

providing a plurality of word lines crossing the bit lines;

providing a plurality of magnetic memory elements disposed at intersections of the bit lines and the word lines, each of the magnetic memory elements comprising a free layer with reversible magnetization and a pinned layer with fixed magnetization;

providing a reference potential generating circuit configured to generate a predetermined reference potential;

providing a write bit line current controlling circuit configured to control write bit line current passing through the bit lines in a write operation on the basis of a reference potential generated by the reference potential generating means; and providing a write word line current controlling circuit configured to control write word line current passing through the word lines in the write operation on the basis of a reference potential generated by the reference potential generating circuit.

10. The method of claim 9, wherein the write word line current is determined by:

determining a distance $r_B$ from the bit lines to the free layers, a distance $r_W$ from the word lines to the free layers, and a number n of the bit lines through which write bit line current $I_B$ passes in a write operation; and determining the write bit line current $I_B$ and the write word line current $I_W$ so as to minimize the write current $I_T$ by using expression (1) representing an asteroid curve expressed by a bit line magnetic field $H_x$ generated by the bit line current $I_B$, a word line magnetic field $H_y$ generated by the write word line current $I_W$ passing through the word lines in the write operation, and a predetermined constant $H_K$, expression (2) representing write current $I_T$ obtained by adding the write bit line current $I_B$ and the write word line current $I_W$, expression (3) representing the bit line magnetic field $H_x$ generated by the bit line current $I_B$ by using a predetermined coefficient a, and expression (4) representing the word line magnetic field $H_y$ generated by the word line current $I_W$ by using the predetermined coefficient a:

$$H_x^{\frac{2}{3}} + H_y^{\frac{2}{3}} = H_k^{\frac{2}{3}} \quad (1)$$

$$I_T = n I_B + I_W \quad (2)$$

$$H_x = a\frac{I_B}{r_B} \quad (3)$$

$$H_y = a\frac{I_W}{r_W}. \quad (4)$$

11. The method of claim 10, wherein the constant $H_K$ is given by expression (5) using a predetermined design margin $m_1$ when a minimum bit line magnetic field that makes it possible to reverse the magnetization of the free layers in any one of the memory cells associated with the bit line through which the write bit line current $I_B$ passes when $H_y=0$ or a minimum word line magnetic field that makes it possible to reverse the magnetization of the free layers in any one of the memory cells associated with a word line through which the write word line current $I_W$ passes when $H_x=0$ is denoted as $H_U$ where:

$$H_K=H_U+m_1 \quad (5).$$

12. The method of claim 9, wherein the bit line magnetic field $H_x$ and the word line magnetic field $H_y$ are given by expressions (6) and (7) using predetermined design margins $m_2$ and $m_3$, respectively, when a maximum bit line magnetic field that makes it impossible to reverse the magnetization of the free layers in any one of the memory cells when $H_y=0$ or a maximum word line magnetic field that makes it impossible to reverse the magnetization of the free layers in any one of the memory cells when $H_x=0$ is denoted as $H_L$:

$$|H_x| \leqq H_{1x}=H_L-m_2 \quad (6)$$

$$|H_y| \leqq H_{2Y}=H_L-m_3 \quad (7).$$

13. A method for optimizing write current in a magnetic memory comprising a plurality of bit lines, a plurality of word lines crossing the bit lines, and a plurality of memory cells disposed at intersections of the bit lines and the word lines, each of the memory cells comprising a free layer with reversible magnetization and a pinned layer with fixed magnetization, the method comprising:

determining a distance $r_B$ from the bit lines to the free layers, a distance $r_W$ from the word lines to the free layers, and a number n of the bit lines through which write bit line current $I_B$ passes in a write operation; and determining the write bit line current $I_B$ and the write word line current $I_W$ so as to minimize the write current $I_T$ by using expression (1) representing an asteroid curve expressed by a bit line magnetic field $H_x$ generated by the bit line current $I_B$, a word line magnetic field $H_y$ generated by the write word line current $I_W$ passing through the word lines in the write operation, and a predetermined constant $H_K$, expression (2) representing write current $I_T$ obtained by adding the write bit line current $I_B$ and the write word line current $I_W$, expression (3) representing the bit line magnetic field $H_x$ generated by the bit line current $I_B$ by using a predetermined coefficient a, and expression (4) representing the word line magnetic field $H_y$ generated by the word line current $I_W$ by using the predetermined coefficient a:

$$H_x^{\frac{2}{3}} + H_y^{\frac{2}{3}} = H_k^{\frac{2}{3}} \quad (1)$$

$$I_T = n I_B + I_W \quad (2)$$

$$H_x = a\frac{I_B}{r_B} \quad (3)$$

$$H_y = a\frac{I_W}{r_W}. \quad (4)$$

14. The method of claim 13, wherein the constant $H_K$ is given by expression (5) using a predetermined design margin ml when a minimum bit line magnetic field that makes it possible to reverse the magnetization of the free layers in any one of the memory cells associated with the bit line through which the write bit line current $I_B$ passes when $H_y$=0 or a minimum word line magnetic field that makes it possible to reverse the magnetization of the free layers in any one of the memory cells associated with a word line through which the write word line current $I_W$ passes when $H_x$=0 is denoted as $H_U$:

$$H_K = H_U + m_1 \quad (5).$$

15. The method of claim 13, wherein the bit line magnetic field $H_x$ and the word line magnetic field $H_y$ are given by expressions (6) and (7) using predetermined design margins $m_2$ and $m_3$, respectively, when a maximum bit line magnetic field that makes it impossible to reverse the magnetization of the free layers in any one of the memory cells when $H_y$=0 or a maximum word line magnetic field that makes it impossible to reverse the magnetization of the free layers in any one of the memory cells when $H_x$=0 is denoted as $H_L$:

$$|H_x| \leqq H_{1x} = H_L - m_2 \quad (6)$$

$$|H_y| \leqq H_{2Y} = H_L - m_3 \quad (7).$$

16. A method of determining a write line current value comprising:

Considering asteroid curves representing bit line magnetic fields $H_x$ generated by write bit line current $I_B$ and word line magnetic fields $H_y$ generated by write word line current $I_W$ for magnetization;

defining an asteroid curve $AC_{out}$ outside the asteroid curves of all memory cells taking manufacture variations and design margins into account; and selecting a write bit line current and a write word line current such that the write current obtained by adding the write bit line current and the write word line current is minimized.

17. The method of claim 16, further comprising selecting the write bit line current and the write word line current such that they generate a synthetic magnetic field on the curve between calculated points of the asteroid curve $Ac_{out}$.

18. The method of claim 16, wherein the a magnetic memory comprises a plurality of bit lines, a plurality of word lines crossing the bit lines, and a plurality of memory cells disposed at intersections of the bit lines and the word lines, each of the memory cells comprising a free layer with reversible magnetization and a pinned layer with fixed magnetization, and wherein selecting a write bit line current and a write word line current further comprises:

determining a distance $r_B$ from the bit lines to the free layers, a distance $r_W$ from the word lines to the free layers, and a number n of the bit lines through which write bit line current $I_B$ passes in a write operation; and determining the write bit line current $I_B$ and the write word line current $I_W$ so as to minimize the write current $I_T$ by using expression (1) representing an asteroid curve expressed by a bit line magnetic field $H_x$ generated by the bit line current $I_B$, a word line magnetic field $H_y$ generated by the write word line current $I_W$ passing through the word lines in the write operation, and a predetermined constant $H_K$, expression (2) representing write current $I_T$ obtained by adding the write bit line current $I_B$ and the write word line current $I_W$, expression (3) representing the bit line magnetic field $H_x$ generated by the bit line current $I_B$ by using a predetermined coefficient a, and expression (4) representing the word line magnetic field $H_y$ generated by the word line current $I_W$ by using the predetermined coefficient a:

$$H_x^{\frac{2}{3}} + H_y^{\frac{2}{3}} = H_k^{\frac{2}{3}} \quad (1)$$

$$I_T = n I_B + I_W \quad (2)$$

$$H_x = a\frac{I_B}{r_B} \quad (3)$$

$$H_y = a\frac{I_W}{r_W}. \quad (4)$$

19. The method of claim 18, wherein the constant $H_K$ is given by expression (5) using a predetermined design margin $m_1$ when a minimum bit line magnetic field that makes it possible to reverse the magnetization of the free layers in any one of the memory cells associated with the bit line through which the write bit line current $I_B$ passes when $H_y$=0 or a minimum word line magnetic field that makes it possible to reverse the magnetization of the free layers in any one of the memory cells associated with a word line through which the write word line current $I_W$ passes when $H_x$=0 is denoted as $H_U$:

$$H_K = H_U + m_1 \quad (5).$$

20. The method of claim 18, wherein the bit line magnetic field $H_x$ and the word line magnetic field $H_y$ are given by expressions (6) and (7) using predetermined design margins $m_2$ and $m_3$, respectively, when a maximum bit line magnetic field that makes it impossible to reverse the magnetization of the free layers in any one of the memory cells when $H_y=0$ or a maximum word line magnetic field that makes it impossible to reverse the magnetization of the free layers in any one of the memory cells when $H_x=0$ is denoted as $H_L$:

$$|H_x| \leqq H_{1x} = H_L - m_2 \quad (6)$$

$$|H_y| \leqq H_{2Y} = H_L - m_3 \quad (7).$$

* * * * *

UNITED STATES PATENT AND TRADEMARK OFFICE

CERTIFICATE OF CORRECTION

PATENT NO. : 6,992,924 B2 
APPLICATION NO. : 10/680051
DATED : January 31, 2006
INVENTOR(S) : Hisatada Miyatake et al.

It is certified that error appears in the above-identified patent and that said Letters Patent is hereby corrected as shown below:

<u>ABSTRACT,</u>
Line 1, “for for” should read -- for --.

<u>Column 1,</u>
Line 39-40, “diffuision” should read -- diffusion --.

<u>Column 19,</u>
Line 38, “m1” should read -- $m_1$ --.

<u>Column 20,</u>
Line 12, “the a magnetic” should read -- a magnetic --.

Signed and Sealed this

Fourteenth Day of November, 2006

JON W. DUDAS

*Director of the United States Patent and Trademark Office*